United States Patent
Self et al.

(10) Patent No.: US 6,768,328 B2
(45) Date of Patent: Jul. 27, 2004

(54) SINGLE POINT PROBE STRUCTURE AND METHOD

(75) Inventors: Bob J. Self, Colorado Springs, CO (US); Kevin M Hall, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 36 days.

(21) Appl. No.: 10/267,435

(22) Filed: Oct. 9, 2002

(65) Prior Publication Data

US 2004/0070411 A1 Apr. 15, 2004

(51) Int. Cl.[7] ............................................... G01R 31/02
(52) U.S. Cl. ...................... 324/754; 324/72.5; 324/761
(58) Field of Search .......................... 324/72.5, 754–758, 324/761–762, 765, 185.1; 439/169, 174, 482, 912

(56) References Cited

U.S. PATENT DOCUMENTS

| | | | | |
|---|---|---|---|---|
| 5,218,293 A | * | 6/1993 | Kan | 324/761 |
| 6,094,042 A | * | 7/2000 | Whiteman | 324/72.5 |
| 6,362,614 B2 | * | 3/2002 | Draving | 324/72.5 |

* cited by examiner

Primary Examiner—Minh N. Tang

(57) ABSTRACT

One or more termination circuits or networks having compensation properties that are operative to reduce reflections occurring between a probe utilized by a test and measurement analyzer to test a device under test (DUT), such as an integrated circuit device, and the device under test itself are employed. The termination circuits are preferably small and less obtrusive than larger connectors and their compensation networking compensates for the connection of the probe to the DUT as well as connection of the cable from the probe to the analyzer performing the test and measurement function. The functionality of the termination circuits may be located at the DUT in a termination network connector or within the structure of the probe itself.

27 Claims, 5 Drawing Sheets

SINGLE POINT PROBE STRUCTURE AND METHOD

FIELD OF THE INVENTION

The invention relates to electrical probes useful for the testing and measurement of electrical circuit devices under test. In particular, the invention relates to a single point, differential structure and method for the testing of devices under test for electrical circuits.

BACKGROUND OF THE INVENTION

In the testing of electrical devices, a single point probe, commonly known as the flying lead, is used to measure a single signal. Often, rather than simply measuring a single signal, however, it is necessary to measure the difference between two signals. A differential probe is capable of measuring the difference between two signals and may be used to measure signals not referenced to a ground, signals with a common interference signal or signals with large dc offsets.

Adaptation of a single flying lead probe as a differential probe poses some difficulty. Two flying leads, rather than one, are required and the spacing of their terminations away from the contact area can introduce unwanted parasitic electrical effects, particularly when measuring fasts signals, that have an adverse impact on accurate signal measurement.

SUMMARY OF THE INVENTION

The probe of the invention includes a termination network operable to minimize reflections between the probe measuring structure and the signals being measured at the device under test. The termination network may reside at the probe structure itself or be located at the device under test in a termination network connector coupled to the device under test. The termination network connector may be a solder-down connector soldered to an electrical device under test at a selected point. The solder-down connector may include a termination network, to minimize reflections, and connection pins for two signals and, optionally, a ground connection for non-differential operation. The probe head includes connection sockets that may be attached to the pins of the solder-down connector to connect it to an analyzer or other measurement device. The solder-down connector may be attached via solder pads on the electrical device under test to one or more of the target signal lines to permit differential measurements.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 1:
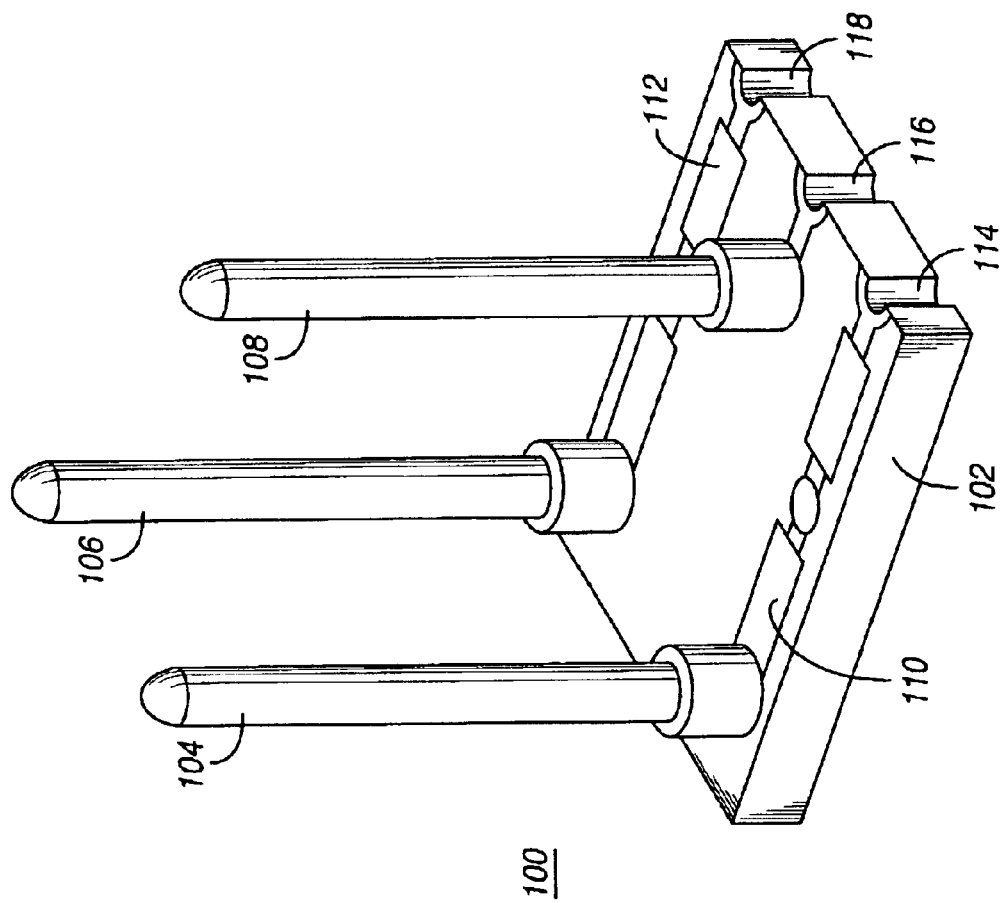
FIG. 1 is a view of a solder-down connector in accordance with an embodiment of the invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The structure and method of the present invention employs one or more termination circuits or networks having compensation properties that are operative to reduce reflections occurring between a probe utilized by a test and measurement analyzer to test a device under test (DUT), such as an integrated circuit device, and the device under test itself. The termination circuits are preferably small and less obtrusive than larger connectors and their compensation networking compensates for the connection of the probe to the DUT as well as connection of the cable from the probe to the analyzer performing the test and measurement function. The functionality of the termination circuits may be located at the DUT in a termination network connector or within the structure of the probe itself. The termination circuits with compensation networking may be referred to as solder-down circuits when its functionality resides with the DUT and they are actually soldered or otherwise affixed to the DUT. The probe itself is a single probe operable to measure single signals or operable as a differential probe, with the ability to probe differential signal pairs. Operation as a single point, non-differential signal probe requires the use of a nominal reference voltage connector pin, such as would be coupled to ground, for instance, in the termination network and a corresponding socket or other coupling element in the probe head in a preferred embodiment of the invention. Referring to FIG. 1, a perspective view of a termination network connector operable to couple one or more probe head pins to DUT signal lines to be probed, in accordance with an embodiment of the present invention, is shown. In this embodiment, the termination circuit resides or is located at the DUT at a termination network connector. Again, as described above, the termination circuit may optionally reside or be located with the probe itself, as will be described in connection with another embodiment. In this embodiment of the invention, the termination network connecter 100 is coupled to the DUT signals to be probed by means of soldering the connector to the DUT at connection points 114, 116, and 118, and thus the termination network connector in this embodiment may be referred to as a solder-down connector 100 that resides at the DUT. The present invention, however, envisions other means of coupling the termination network connector to the DUT in addition to soldering. Thus this example is considered to be exemplary in nature and is not intended to limit the invention to requiring the use of soldering to couple the termination network connector to the DUT. For example, very short flying leads may be used to connect the connection pins of the connector to the corresponding sockets, particularly if the matching network resides in the probe head itself.

Connector 100 comprises a ceramic substrate 102 to which connection pins 104, 106 and 108 are attached. As will be described further, the use of connection pin 108 as a ground pin and corresponding socket 206 in FIG. 2 permits the probe to measure two single signals via connector pins 104 and 106; omitting ground pin 108 and corresponding ground socket 206 permits the probe head to operate as a differential probe to probe differential signal pairs via connector pins 104 and 106. Thus, the inclusion of ground connection pin 108 and corresponding socket 206 of FIG. 2 permits the connector 100 to measure either single signals or a different signal pair. The additional connector pin 108 is suitable to be coupled to any nominal reference voltage level, of which ground is but one example. Ground reference is used here for illustrative purposes.

The connection pins are made of gold plated brass or other suitable electrical conductor. The connection pins 104 and 106 provide connection to the target signal lines on the DUT via termination networks or circuits 110 and 112. These termination networks, which may be RCR circuits, for example, minimize reflections at the interface between the probe and the device under test. The termination network could be a resistor, for example, or any other structure suitable for minimizing reflections at the interface. The optional connection pin 108 provides a ground connection. The optional ground connection pin 108 allows the probe to be used as a standard, single signal probe as well as a differential probe. The connector 100 is adapted to be coupled to the device under test at connection points 114, 116 and 118, such as by soldering or other coupling means. In operation of a preferred embodiment, connector 100 is a solder-down connector that is soldered to the device under test at the selected location, so that the solder connection points 114, 116 and 118 are electrically coupled to the desired signal lines on the device under test to be tested. The device under test may be provided with solder pads to facilitate this connection.

Figure 2A:
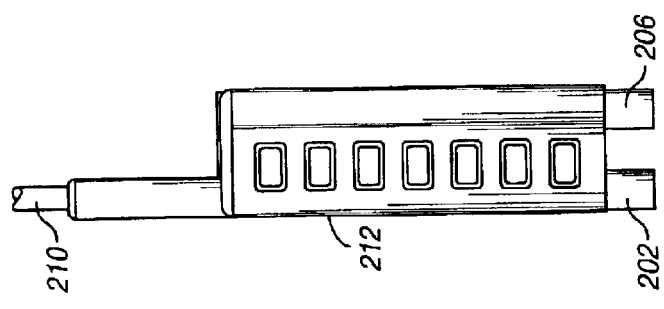
FIGS. 2A–2C are a series of views of a probe head in accordance with an embodiment of the invention.
Figure 2B:
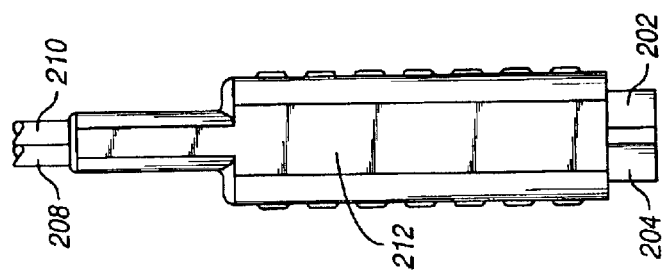
Figure 2C:
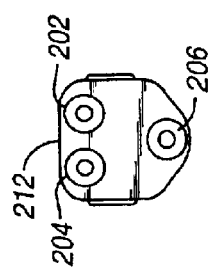

A probe head is then coupled to the termination network connector to accommodate testing of the DUT. Referring now to the side, front, and end views, respectively, of FIGS. 2A, 2B, and 2C, one embodiment of a probe head 200 operable to couple to connector 100 of FIG. 1 is shown with coupling elements, shown here as sockets 202, 204 and 206, at one end. FIGS. 2A and 2B illustrate adjacent side views of probe head 200, while FIG. 2C illustrates an end view in which sockets 202, 204, and 206 may be seen. These sockets are aligned to mate with the pins of the solder-down connector 100. If the solder-down connector has no ground pin, then socket 206, which mates with ground connection pin 108, is omitted. The other end of the probe head is coupled to an analyzer or other measurement instrument. The sockets 202 and 204 couple to the signal lines and connect to the inner conductors of coaxial cables 208 and 210, respectively. The socket 206 couples to ground and may be connected to the outer conductor of coaxial cables 208 and 210. The sockets may be embedded in an over-molding or molded body 212 that serves to keep the sockets in the correct alignment to mate with the pins of the solder-down connector.

Figure 3:
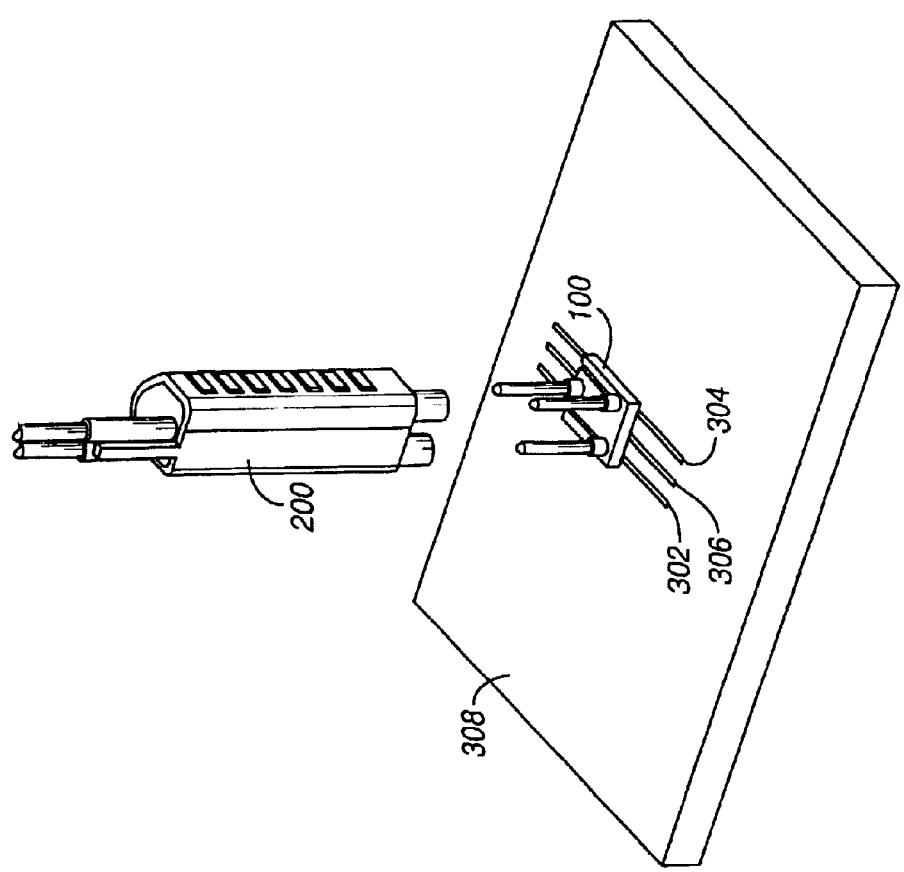
FIG. 3 is a view of a probe head and a solder-down connector in accordance with an embodiment of the invention, showing the solder-down connector attached parallel to the surface of a device under test.
Figure 4:
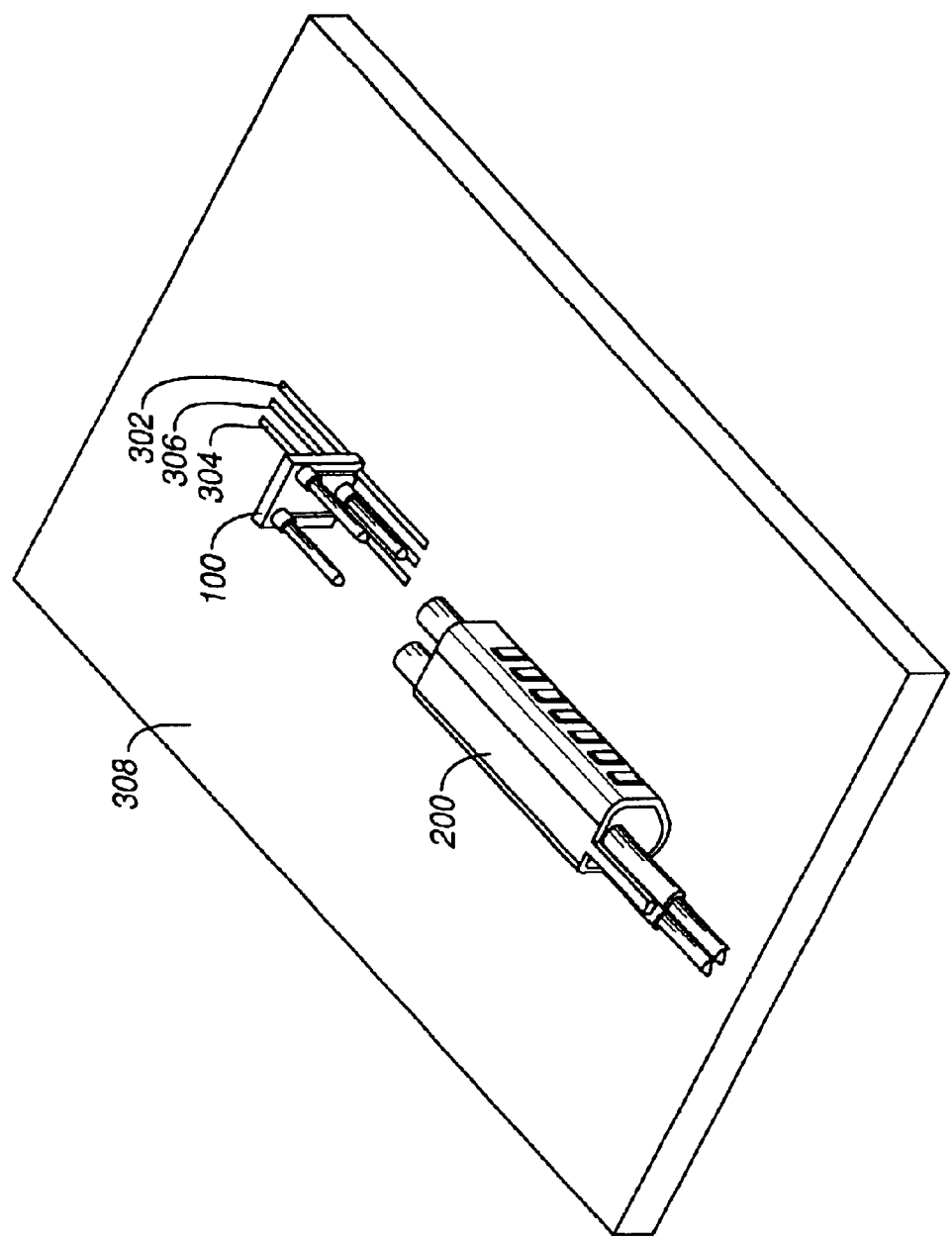
FIG. 4 is a view of a probe head and a solder-down connector in accordance with an embodiment of the invention, showing the solder-down connector attached perpendicular to the surface of a device under test.

FIGS. 3 and 4 show examples of how the connector 100 is coupled to the signal lines of the device under test. In FIG. 3 the connector 100 is fixed to the signal lines 302 and 304 and the ground line 306 of the device under test 308 with the substrate of the connector parallel to the signal lines. One or more connection points, such as mechanical solder points, may be used to attach the connector to the device under test. The sockets of the probe head 200 are adapted to be mated with the pins of the connector 100, as described above in connection with FIG. 1 and FIGS. 2A–2C. In FIG. 4 the connector 100 is coupled to the signal lines 302 and 304 and the ground line 306 of the device under test 308 with the substrate of the connector 100 at 90° to the signal lines. Other angles of attachment may be used to facilitate coupling of the probe head to the solder-down connector and are included within the scope of the invention.

The connector, particularly the solder-down connector, may be inexpensive and thus easily left attached to the device under test after the testing has been completed. It may be smaller and less intrusive than larger, prior art connectors. Alternatively, it may be removed and discarded.

Figures 5, 6, 7:
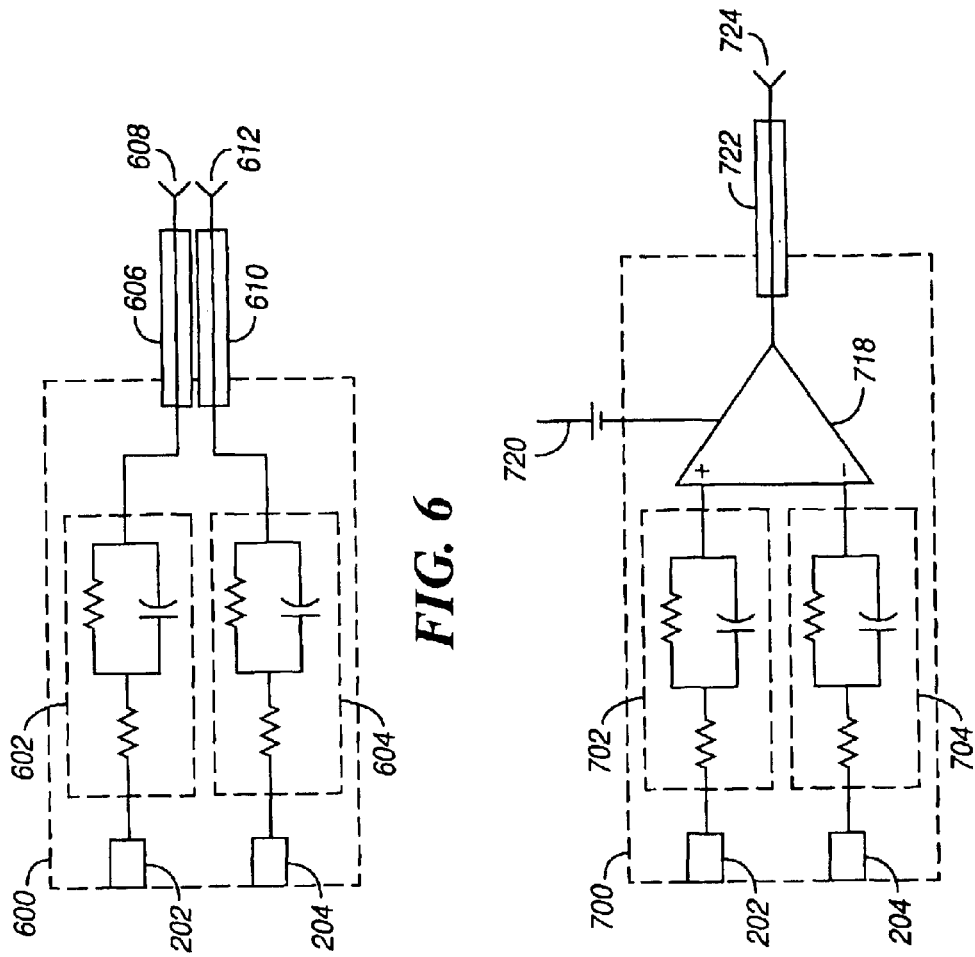
FIG. 5 is a diagrammatic representation of a termination network in accordance with an embodiment of the invention.
FIG. 6 is a diagrammatic representation of a passive probe head in accordance with an embodiment of the invention.
FIG. 7 is a diagrammatic representation of an active probe head in accordance with an embodiment of the invention.

The termination networks or circuits, 110 and 112 in FIG. 1, compensate for the electrical properties of the probe system and thus compensate for any mismatch between the probe and the device under test, including any parasitic capacitive effects introduced by the connector or the cable from the probe head to the analyzer that receives and analyzes the signals measured by the probe. The termination network could be a resistor, for example, or any other structure suitable for minimizing reflections at the interface. The termination network, for example, may be an RCR network as shown in FIG. 5. The network 500 comprises a first resistor 502 in parallel with capacitor 504, together coupled in series with a second resistor 506. In an example, the capacitor has a value of 300 fF, the first resistor has a value of 20 kΩ and the second resistor has a value of 125 Ω.

In a further embodiment of the probe, the ground pin and the corresponding socket are omitted, allowing the probe to operate only as a differential probe, measuring a differential signal pair. In this embodiment, the cables 208 and 210 may be shielded coaxial cables with a common ground or a twisted-pair of cables.

In addition to the termination circuits or networks residing with the DUT, as described above, the termination circuits or networks may also reside with the probe itself. In a further embodiment, the termination networks are included with the probe head rather than in a termination network connector at the DUT. FIG. 6 is a diagrammatic representation of a probe head 600 having two passive termination networks. Referring to FIG. 6, the probe head has two sockets, 202 and 204, or other suitable coupling means, connected via termination networks 602 and 604 to cables 606 and 610. The other ends of the cables 606 and 608 are terminated in connectors 610 and 612. Termination networks 602 and 604 comprise passive RCR circuits as depicted in FIG. 6.

A still further embodiment is shown in FIG. 7, in which probe head 700 contains active termination networks. The probe head 700 has two sockets, 202 and 204, or other suitable means for coupling the probe head to the DUT, connected via termination networks 702 and 704, to the inputs of a differential amplifier 718. Differential amplifier 718 is coupled to a power supply 720. The output of the differential amplifier 718 is coupled to cable 722. The cable is terminated at connector 724, which may be used to couple the probe head 700 to an analyzer or other test and measurement equipment capable of receiving the signals probed by probe head 700.

In the embodiments shown in FIGS. 6 and 7, the termination networks, while not positioned at the DUT itself, as was the case in the embodiment of FIGS. 1–4, are still positioned very close to the connection point of the probe head with the device under test so that reflections are kept to a minimum. The embodiments of FIGS. 6 and 7 have the advantage that the cost of a termination network connection, such as the solder-down connector shown in FIG. 1, is not incurred. Also in the embodiments of FIGS. 6 and 7, the ceramic substrate in the solder-down connector may be replaced with other non-conducting materials, such as $FR^4$ board, as desired.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A system operable to measure one or more signals of a device under test, comprising:
   a termination network connector, comprising:
   a first connector coupling element operable to couple the termination network connector to a first signal of the device under test;
   a first connector element;
   a first termination network that couples the first connector element to the first coupling element;
   a second connector coupling element operable to couple the termination network connector to a second signal of the device under test;
   a second connector element; and
   a second termination network that couples the second connector element to the second coupling element; and
   a probe element operable to measure one or more signals of the device under test, comprising:
   a first probe coupling element operable to be coupled to the first connector element of the termination network connector; and
   a second probe coupling element operable to be coupled to the second connector element of the termination network connector;
   wherein the first and second termination networks of the termination network connector compensate for reflections between the first and second probe coupling elements of the probe element and the corresponding first and second connector elements of the termination network connector during measurement of the first and second signals of the device under test by the probe element.

2. The system of claim 1, wherein the first and second connector coupling elements are solder connection points from the termination network connector to the device under test.

3. The system of claim 1, wherein the termination network connector further comprises a ceramic substrate, and wherein the first and second termination networks are integrated circuits formed on the ceramic substrate.

4. The system of claim 1, wherein the first and second connector elements are first and second connector pins.

5. The system of claim 1, wherein the probe element is a probe head of a probe.

6. The system of claim 1, wherein the first and second probe coupling elements are sockets.

7. The system of claim 1, wherein the first and second signals of the device under test are a differential signal pair.

8. The system of claim 1, wherein the first and second termination networks are passive circuits.

9. The system of claim 1, wherein the termination network connector further comprises:
   a third connector coupling element operable to couple the termination network connector to a nominal reference voltage of the device under test; and
   wherein the probe element further comprises:
   a third probe coupling element operable to be coupled to the third connector coupling element of the termination network connector.

10. The system of claim 9, wherein the third connector coupling element is a solder connection point from the termination network connector to the nominal reference voltage of the device under test.

11. The system of claim 9, wherein the probe element further comprises:
    a first coaxial cable coupled to the first probe coupling element; and a second coaxial cable coupled to the second probe coupling element; wherein the third probe coupling element is coupled to an outer conductor of said first and second coaxial cables, the first probe coupling element is coupled to an inner conductor of the first coaxial cable, and the second probe coupling element is coupled to an inner conductor of the second coaxial cable.

12. The system of claim 1, wherein the termination network connector is coupled in a position substantially parallel to the surface of the device under test.

13. The system of claim 1, wherein the termination network connection is coupled is a position substantially perpendicular to the surface of the device under test.

14. The system of claim 1, wherein the first coupling element is coupled to a first end of a first cable in the probe element, the second probe coupling element is coupled to a first end of a second cable in the probe element, and wherein the first and second probed coupling elements, the first end of the first cable and the first end of the second cable are embedded in a molded body.

15. A probe operable to measure one or more signals of a device under test, comprising:
    a first probe element operable to be coupled to a first signal of the device under test;
    a second probe element operable to be coupled to a second signal of the device under test; and
    a termination element coupled to the first and second probe elements that compensates for reflections between the first and second probe elements and the corresponding first and second signals of the device under test during measurement of the first and second signals by the probe, the termination element comprising:
    a first termination circuit coupled to the first probe element and generating a first output signal:
    a second termination circuit coupled to the second probe element and generating a second output signal, and
    an active circuit operable to receive the first output signal from the first termination network and the second output signal from the second termination network as inputs and to generate a difference between the two signals as output.

16. The probe of claim 15, wherein the first and second termination circuits are RC circuits.

17. The probe of claim 15, wherein the first and second signals of the device under test are a differential signal pair.

18. The probe of claim 15, further comprising:
    a third probe element operable to couple the probe to a nominal reference voltage of the device under test.

19. A probe operable to measure one or more signals of a device under test, comprising:
   a first probe element operable to be coupled to a first signal of the device under test;
   a second probe element operable to be coupled to a second signal of the device under test; and
   a termination element comprising:
      a first termination network coupled to first probe element and generating a first output signal;
      a second termination network coupled to the second probe element and generating a second output signal; and
      a differential amplifier element receiving the first output signal from the first termination network and the second output signal from the second termination network and being coupled to a power supply reference,
      wherein the first termination network is active and comprises an RC circuit operable to compensate for reflections between the first probe element and the first signal of the device under test and the second termination network is active and comprises an RC circuit operable to compensate for reflections between the second probe element and the second signal of the device under test.

20. A method for the measurement of one or more signals of a device under test, comprising:
   providing a termination network connector with a first termination network that couples a first connector element to a first connector coupling element;
   providing the termination network connector with a second termination network that couples a second connector element to a second connector coupling element;
   coupling the first connector coupling element to a first signal of the device under test and coupling the first connector element to a first probe coupling element of a probe;
   coupling the second connector coupling element to a second signal of the device under test and coupling the second connector element to a second probe coupling element of the probe;
   measuring the first and second signals of the device under test by means of the first and second probe coupling elements of the probe coupled to the first and second connector elements of the termination network connector,
   wherein during measurement, the first and second termination networks of the termination network connector compensate for reflections between the first and second probe coupling elements of the probe and the corresponding first and second connector elements of the termination network connector.

21. The method of claim 20, further comprising:
   coupling a third connector coupling element of the termination network connector to a nominal voltage of the device under test;
   coupling a third connector element of the termination network connector to the third connector coupling element and to a third probe coupling element of the probe.

22. The method of claim 21, further comprising at least one of:
   measuring the first signal with respect to the nominal voltage by means of the first and third probe coupling elements of the probe coupled to the first and third connector elements of the termination network connector, respectively; and
   measuring the second signal with respect to the nominal voltage by means of the second and third probe coupling elements of the probe coupled to the second and third connector elements of the termination network connector, respectively.

23. A method for the measurement of one or more signals of a device under test, comprising:
   coupling a termination element to a first probe element and a second probe element of a probe;
   coupling the first probe element of the probe to a first signal of the device under test and coupling the second probe element of the probe to a second signal of the device under test;
   measuring the difference between the first and second signals of the device under test by the first and second probe elements, respectively,
   wherein the termination element compensates for reflections between the first and second probe elements and the corresponding first and second signals of the device under test during measurement of the first and second signals.

24. The method of claim 23, wherein coupling the termination element to the first and second probe elements further comprises:
   coupling a first termination circuit to the first probe element; and
   coupling a second termination circuit to the second probe element,
   wherein the first termination circuit is operable to compensate for reflections between the first probe element and the first signal of the device under test and the second termination circuit is operable to compensate for reflections between the second probe element and the second signal of the device under test.

25. A structure suitable for minimizing reflections between a device under test and a probe measuring one or more signals of the device under test, comprising:
   a termination network element operable to be coupled to the device under test and the probe, comprising:
      a first connector coupling element operable to couple the termination network element to a first signal of the device under test;
      a first connector element operable to be coupled to the probe;
      a first termination network that couples the first connector element to the first coupling element;
      a second connector coupling element operable to couple the termination network element to a second signal of the device under test;
      a second connector element operable to be coupled to the probe; and
      a second termination network that couples the second connector element to the second coupling element; and
   wherein the first and second termination networks are operable to compensate for reflections between the probe and the first and second signals during measurement of the device under test by the probe.

26. The structure of claim 25, wherein the termination network element further comprises:
   a third connector coupling element operable to couple the termination network element to a nominal reference voltage of the device under test and to the probe.

27. The structure of claim 25, wherein the first and second signals of the device under test are a differential signal pair.

* * * * *